United States Patent
Kim

(10) Patent No.: US 10,886,246 B2
(45) Date of Patent: Jan. 5, 2021

(54) FAN-OUT SEMICONDUCTOR PACKAGE

(71) Applicant: SAMSUNG ELECTRONICS CO., LTD., Suwon-si (KR)

(72) Inventor: Bong Soo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/351,784

(22) Filed: Mar. 13, 2019

(65) Prior Publication Data
US 2020/0035632 A1    Jan. 30, 2020

(30) Foreign Application Priority Data

Jul. 27, 2018  (KR) .................. 10-2018-0087649

(51) Int. Cl.
*H01L 23/00*    (2006.01)
*H01L 23/532*   (2006.01)
(Continued)

(52) U.S. Cl.
CPC .......... *H01L 24/09* (2013.01); *H01L 23/3107* (2013.01); *H01L 23/481* (2013.01);
(Continued)

(58) Field of Classification Search
CPC ......... H01L 24/09; H01L 24/33; H01L 24/20; H01L 24/02; H01L 23/53238; H01L 23/481; H01L 23/49527; H01L 23/3107
(Continued)

(56) References Cited

U.S. PATENT DOCUMENTS

| 6,876,554 B1 * | 4/2005 | Inagaki | ................... H01G 2/06 361/763 |
| 9,265,158 B2 * | 2/2016 | Mano | ................... H05K 1/185 |

(Continued)

FOREIGN PATENT DOCUMENTS

| KR | 10-1145041 A1 | 9/2013 |
| KR | 10-2018-0031244 A | 3/2018 |

(Continued)

OTHER PUBLICATIONS

Communication dated Aug. 2, 2019, issued by the Taiwan Patent Office in counterpart Taiwan Application No. 108108125.
(Continued)

*Primary Examiner* — Dao H Nguyen
(74) *Attorney, Agent, or Firm* — Sughrue Mion, PLLC

(57) ABSTRACT

A fan-out semiconductor package includes: a frame including first to third insulating layers, a first wiring layer disposed on a first surface of the first insulating layer and embedded in the second insulating layer, and a second wiring layer disposed on the third insulating layer, and having a through-hole penetrating through the first to third insulating layers; a semiconductor chip disposed in the through-hole and having an active surface on which connection pads are disposed and an inactive surface opposing the active surface; an encapsulant covering at least portions of each of the frame and the semiconductor chip and filling at least portions of the through-hole; and a connection structure disposed on the frame and the active surface of the semiconductor chip and including redistribution layers electrically connected to the connection pads. The first and second wiring layers are electrically connected to the connection pads.

16 Claims, 11 Drawing Sheets

(51) Int. Cl.
  *H01L 23/48* (2006.01)
  *H01L 23/31* (2006.01)
  *H01L 23/495* (2006.01)

(52) U.S. Cl.
  CPC .. *H01L 23/49527* (2013.01); *H01L 23/53238* (2013.01); *H01L 24/33* (2013.01); *H01L 2224/02371* (2013.01); *H01L 2224/02377* (2013.01); *H01L 2224/02379* (2013.01)

(58) Field of Classification Search
  USPC ............... 257/692, 676, 698, 774, E25.029, 257/E25.013, E25.023, E23.079, E23.069, 257/E23.004, E23.031, E21.502, E21.503; 438/109, 113, 123, 126
  See application file for complete search history.

(56) References Cited

U.S. PATENT DOCUMENTS

| | | |
|---|---|---|
| 9,853,003 B1 | 12/2017 | Han et al. |
| 2013/0241042 A1 | 9/2013 | Kwon |
| 2013/0249101 A1 | 9/2013 | Lin et al. |
| 2014/0070396 A1* | 3/2014 | Kyozuka ................ H01L 24/19 257/698 |
| 2017/0040265 A1* | 2/2017 | Park ...................... H01L 24/19 |
| 2017/0133309 A1* | 5/2017 | Kim ...................... H01L 24/19 |
| 2017/0148699 A1* | 5/2017 | Seo ..................... H01L 23/3128 |
| 2017/0278766 A1 | 9/2017 | Kim et al. |
| 2017/0278806 A1 | 9/2017 | Kuo et al. |
| 2018/0082962 A1 | 3/2018 | Lee et al. |
| 2018/0096968 A1 | 4/2018 | Lee et al. |
| 2018/0108542 A1 | 4/2018 | Pagaila et al. |
| 2020/0066613 A1* | 2/2020 | Lee ..................... H01L 23/5389 |

FOREIGN PATENT DOCUMENTS

| | | |
|---|---|---|
| KR | 10-2018-0037529 A | 4/2018 |
| TW | 201737428 A | 10/2017 |
| TW | 201803046 A | 1/2018 |
| TW | 201816969 A | 5/2018 |

OTHER PUBLICATIONS

Communication dated Nov. 11, 2019, issued by the Korean Intellectual Property Office in counterpart Korean Application No. 10-2018-0087649.

* cited by examiner

I–I'

FAN-OUT SEMICONDUCTOR PACKAGE

CROSS-REFERENCE TO RELATED APPLICATION(S)

This application claims benefit of priority to Korean Patent Application No. 10-2018-0087649 filed on Jul. 27, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection pads of a semiconductor chip may be redistributed up to a fan-out region.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a frame including wiring layers formed therein may be introduced to a region in which a semiconductor chip is encapsulated and non-uniformity of an insulating distance of a redistribution region occurring due to thicknesses of the wiring layers may be solved.

According to an aspect of the present disclosure, a fan-out semiconductor package may be provided, in which a frame having wiring layers on both surfaces of a core layer such as a copper clad laminate (CCL), or the like, is formed through a double-sided build-up process, but a wiring layer on a lower surface of the core layer is embedded in the frame and a wiring layer on an upper surface of the core layer protrudes from the frame.

According to an aspect of the present disclosure, a fan-out semiconductor package may include: a frame including a first insulating layer, a second insulating layer disposed on a first surface of the first insulating layer, a third insulating layer disposed on a second surface of the first insulating layer opposing the first surface, a first wiring layer disposed on the first surface of the first insulating layer and embedded in the second insulating layer, and a second wiring layer disposed on the third insulating layer, and having a through-hole penetrating through the first to third insulating layers; a semiconductor chip disposed in the through-hole and having an active surface on which connection pads are disposed and an inactive surface opposing the active surface; an encapsulant covering at least portions of each of the frame and the semiconductor chip and filling at least portions of the through-hole; and a connection structure disposed on the frame and the active surface of the semiconductor chip and including redistribution layers electrically connected to the connection pads. The first and second wiring layers may be electrically connected to the connection pads.

According to another aspect of the present disclosure, a fan-out semiconductor package may include: a frame including a first wiring layer embedded in an insulating material so that a lower surface of the first wiring layer is exposed in a lower portion of the frame and a second wiring layer protruding on the insulating material in an upper portion of the frame, and having a through-hole; a semiconductor chip disposed in the through-hole and having connection pads; an encapsulant covering at least portions of each of the frame and the semiconductor chip and filling at least portions of the through-hole; and a connection structure disposed below the frame and the semiconductor chip and including redistribution layers electrically connected to the connection pads.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of "upper" and "lower" may be changed any time.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
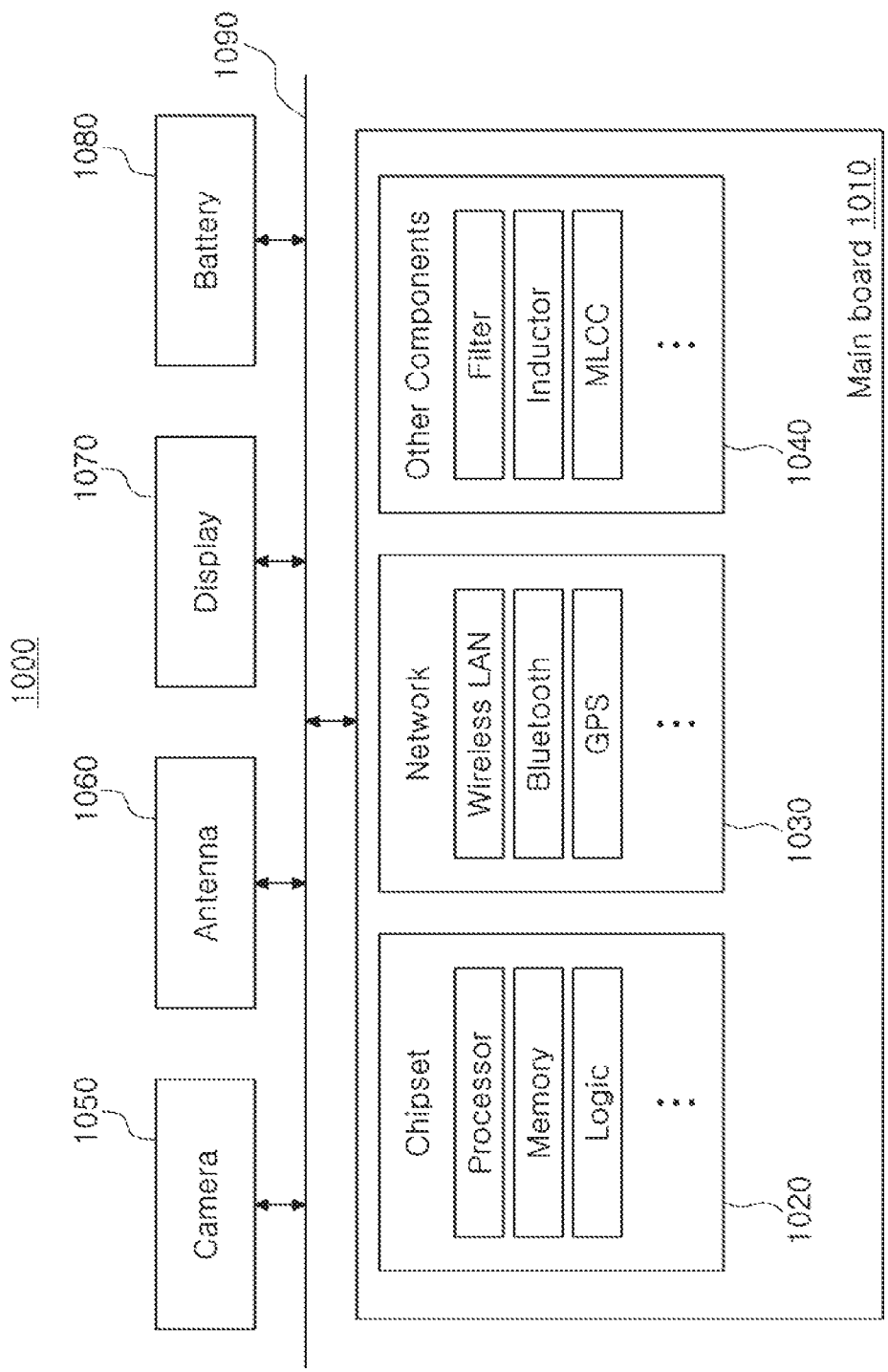
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
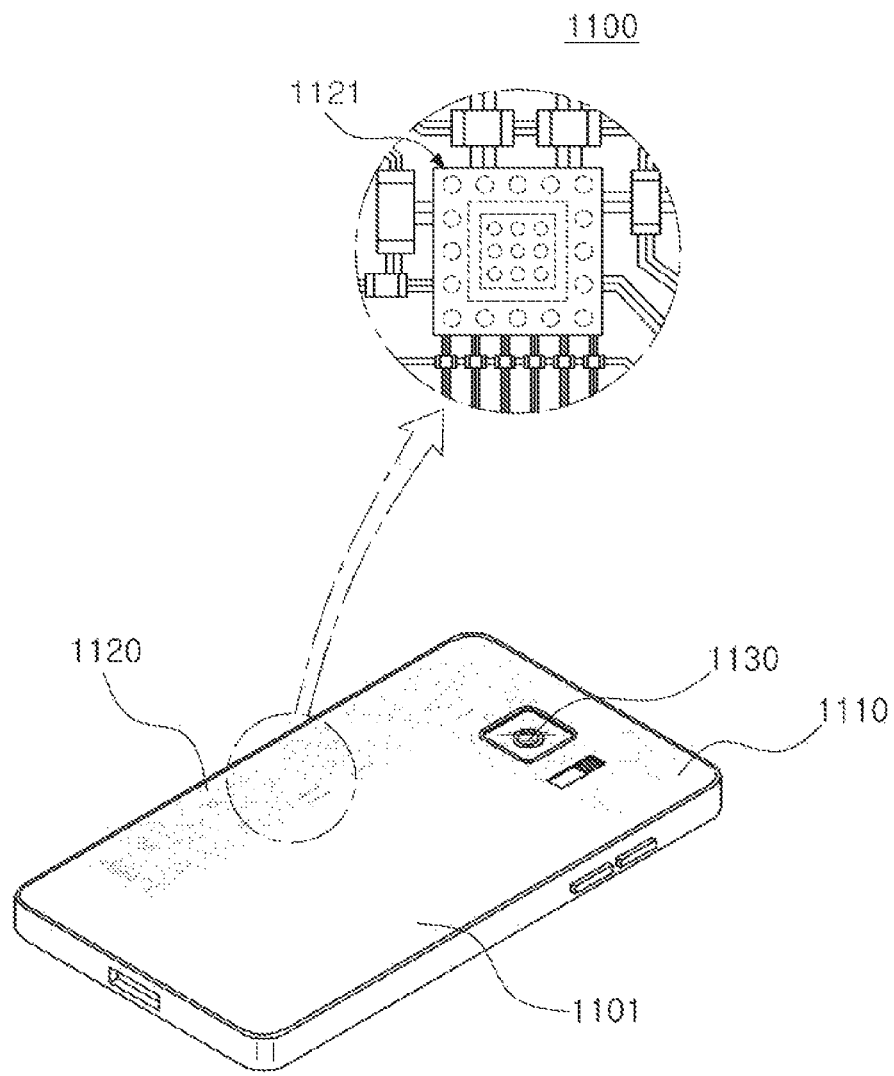
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a mainboard, or the like, may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
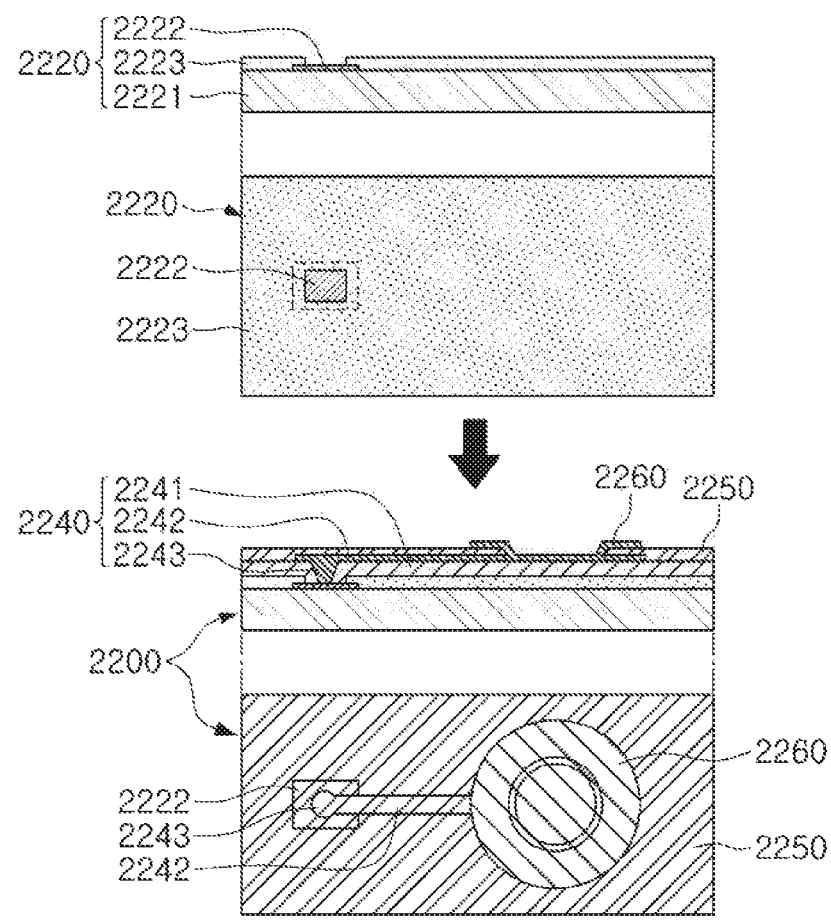
FIGS. 3A and 3B are schematic cross-sectional views illustrating states of a fan-in semiconductor package before and after being packaged.
Figure 3B:
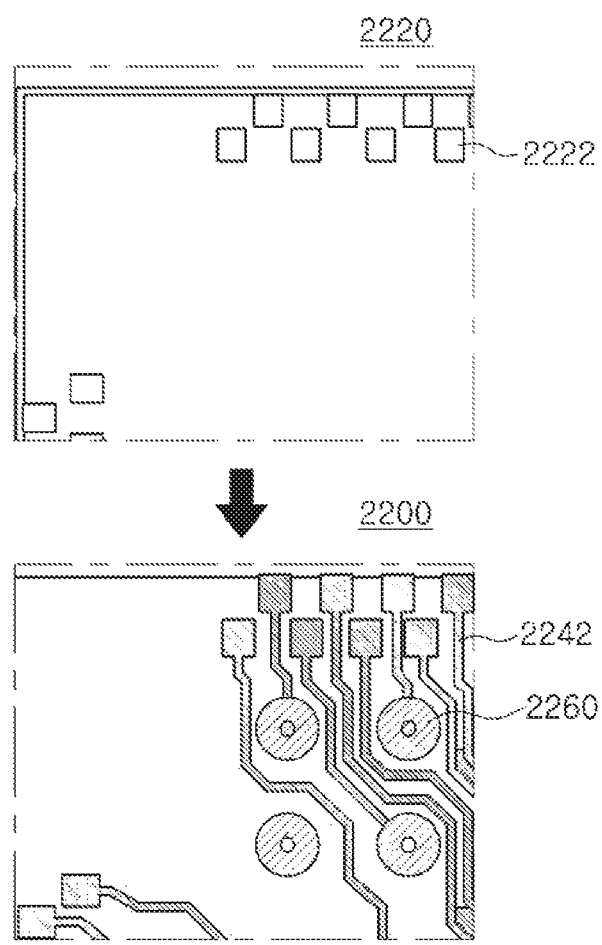

FIGS. 3A and 3B are schematic cross-sectional views illustrating states of a fan-in semiconductor package before and after being packaged.

Figure 4:
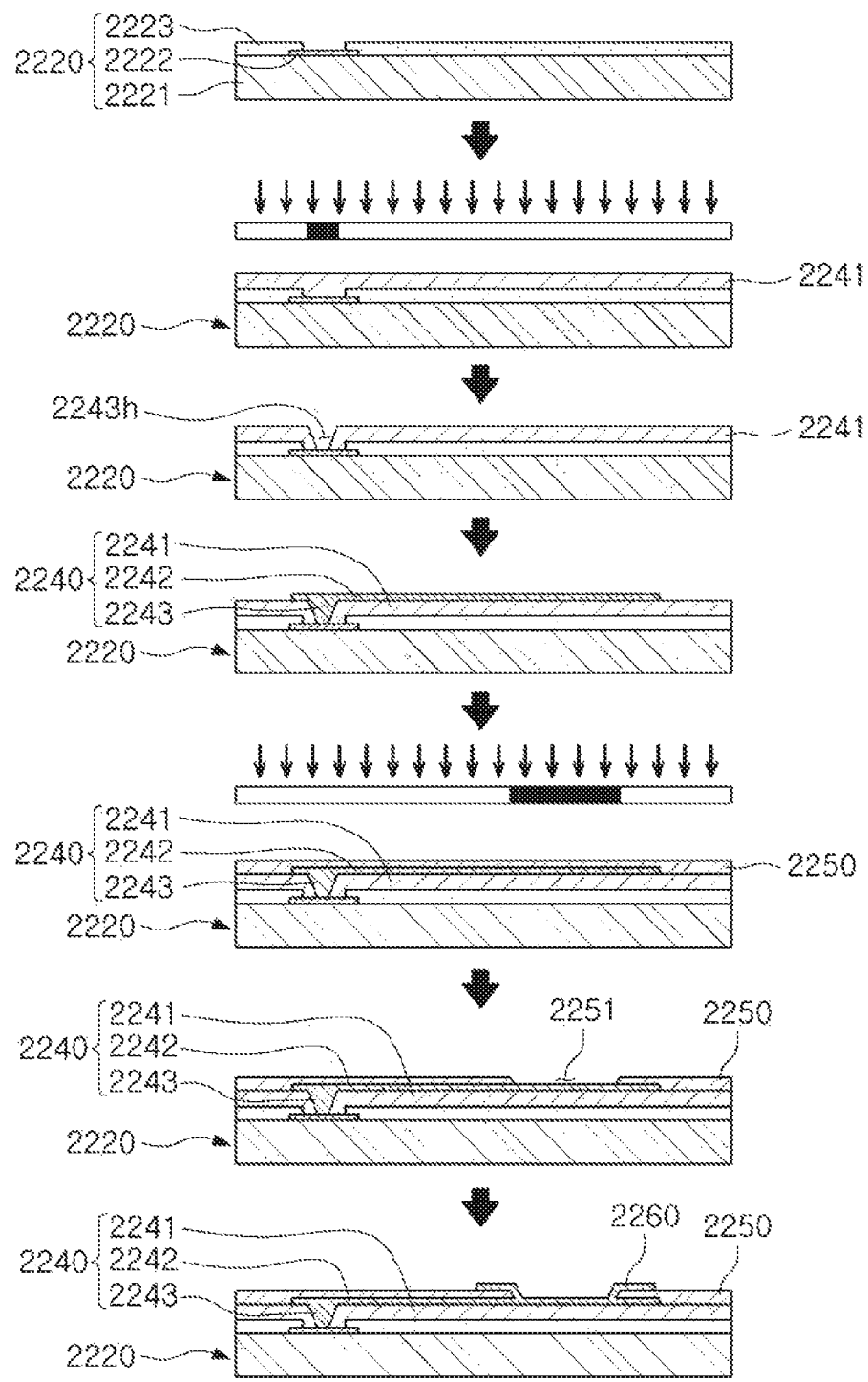
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal 2260, or the like, may be formed. That is, a fan-in semiconductor package 2200 including, for example, the semiconductor chip 2220, the connection structure 2240, the passivation layer 2250, and the underbump metal 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in electronic component package on the mainboard of the electronic device.

Figure 5:
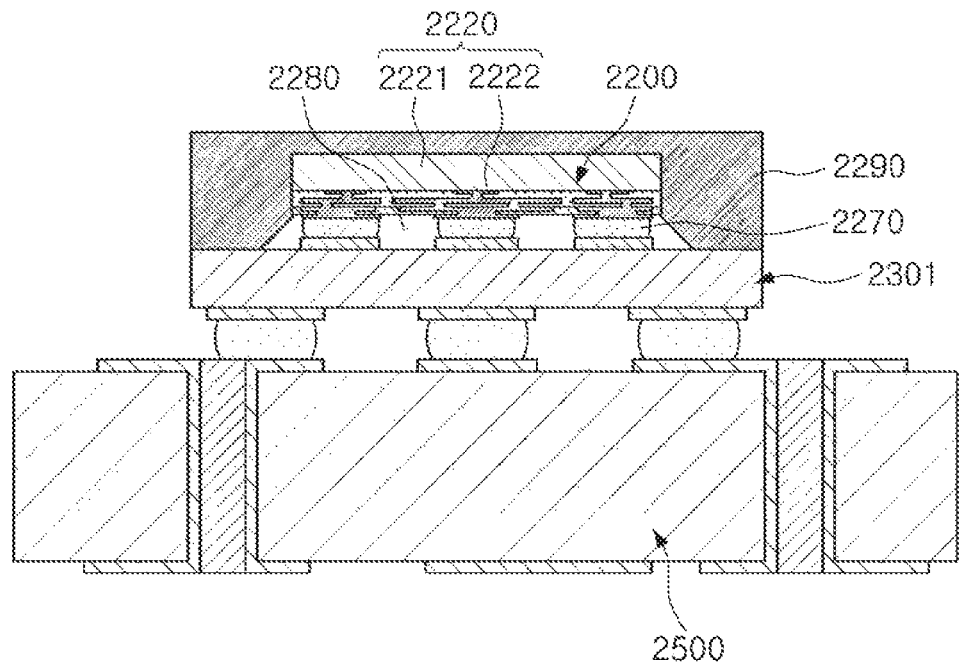
FIG. 5 is a schematic cross-sectional view illustrating a case in which a fan-in semiconductor package is mounted on a printed circuit substrate and is ultimately mounted on a main board of an electronic device.

FIG. 5 is a schematic cross-sectional view illustrating a case in which a fan-in semiconductor package is mounted on a printed circuit substrate and is ultimately mounted on a main board of an electronic device.

Figure 6:
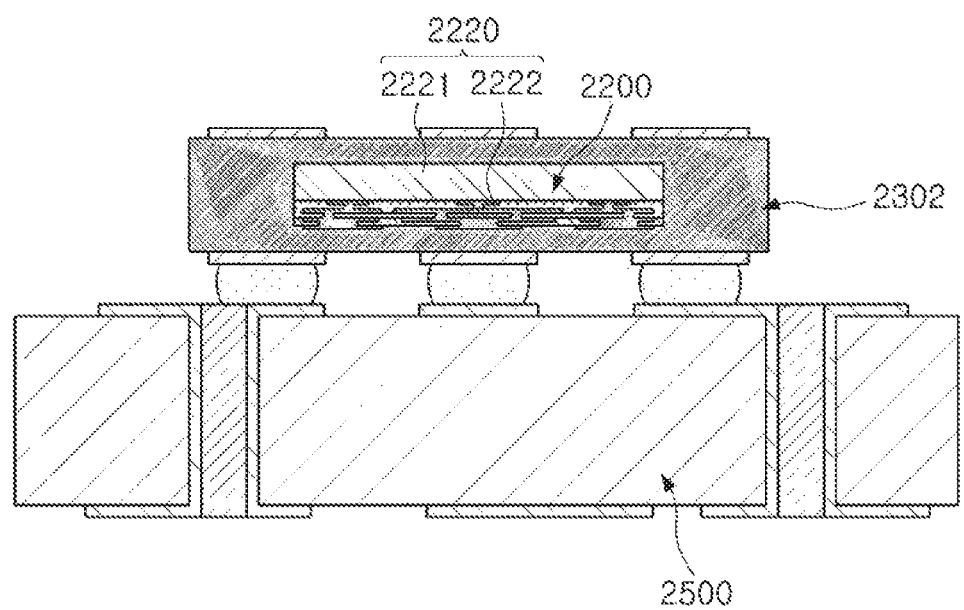
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
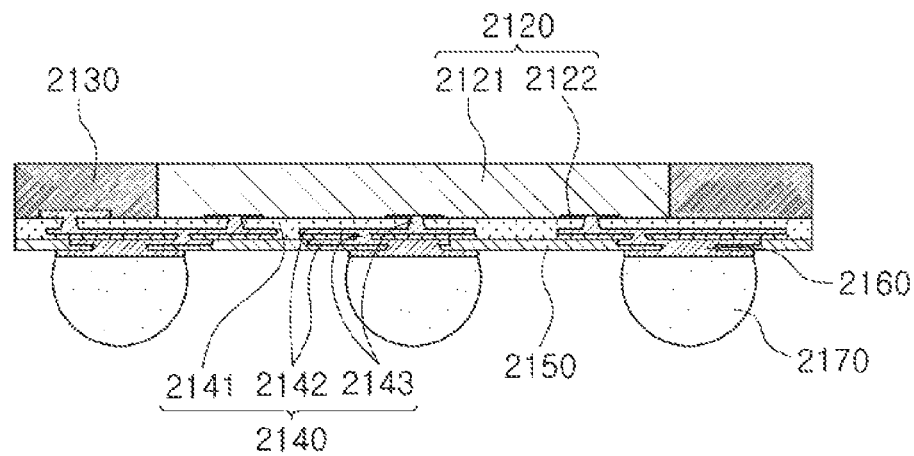
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal 2160 may further be formed in openings of the passivation layer 2150. Solder balls 2170 may further be formed on the underbump metal 2160. The semiconductor chip 2120 may be an integrated circuit (IC) including a body 2121, the connection pads 2122, and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
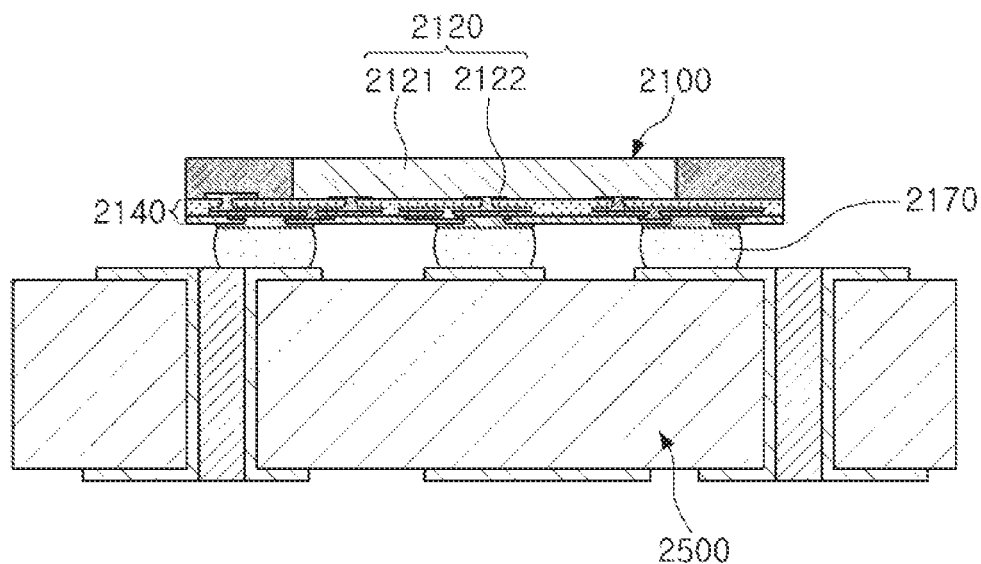
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the main board of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

A fan-out semiconductor package in which a frame including wiring layers formed therein is introduced to a region in which a semiconductor chip is encapsulated using a relatively simple and economical method, and non-uniformity of an insulating distance of a redistribution region occurring due to thicknesses of the wiring layer may be solved will hereinafter be described with reference to the accompanying drawings.

Figure 9:
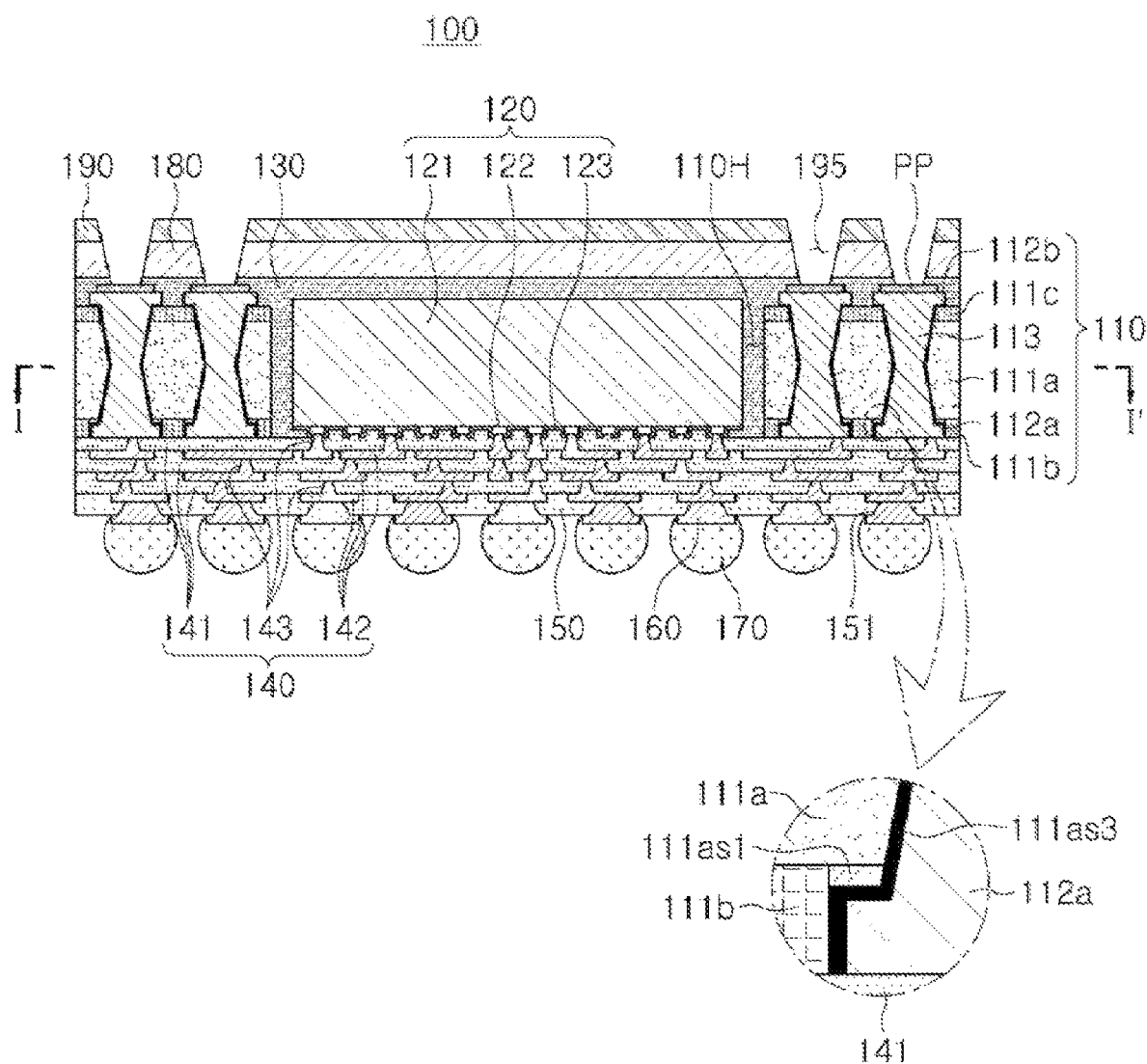
FIG. 9 is a schematic cross-sectional view illustrating a fan-out semiconductor package according to an exemplary embodiment in the present disclosure.

FIG. 9 is a schematic cross-sectional view illustrating a fan-out semiconductor package according to an exemplary embodiment in the present disclosure.

Figure 10:
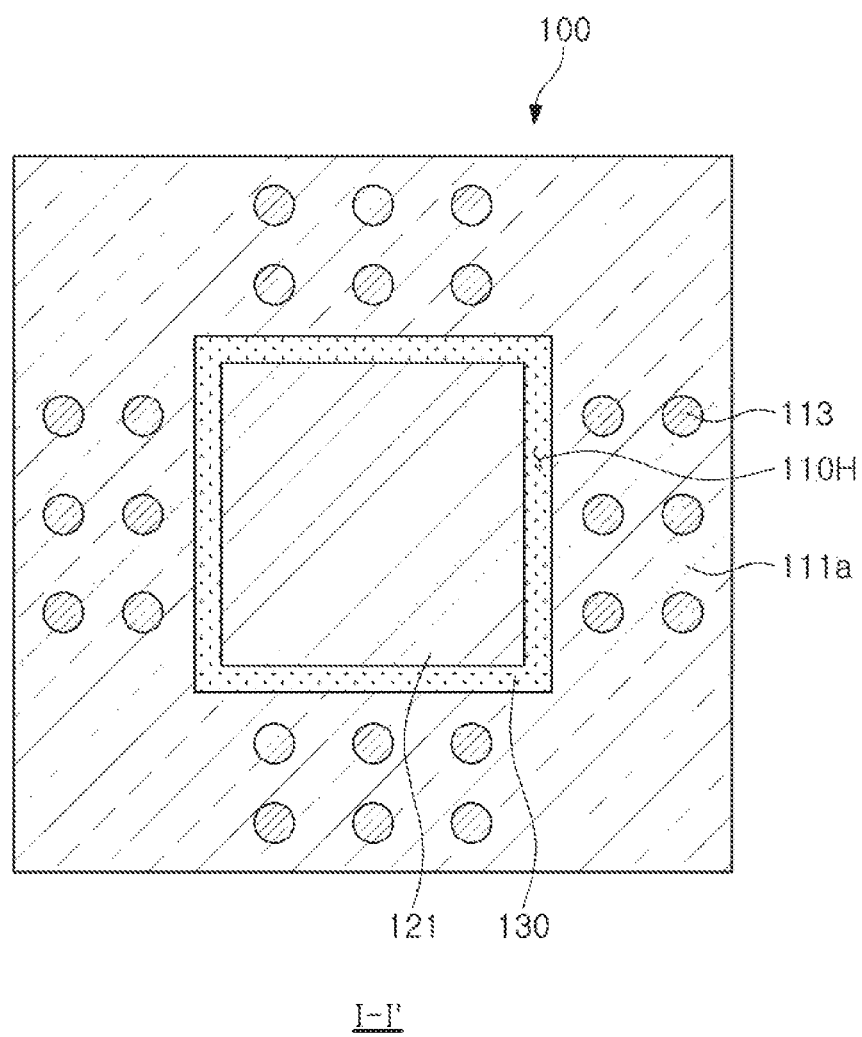
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to FIGS. 9 and 10, a fan-out semiconductor package 100 according to an exemplary embodiment in the present disclosure may include a frame 110 having a through-hole 110H, a semiconductor chip 120 disposed in the through-hole 110H of the frame 110, an encapsulant 130 covering at least portions of each of the frame 110 and the semiconductor chip 120 and filling at least portions of the through-hole 110H, and a connection structure 140 disposed on the frame 110 and an active surface of the semiconductor chip 120. Here, the frame 110 may include a first insulating layer 111a, a second insulating layer 111b disposed on a lower surface of the first insulating layer 111a, a third insulating layer 111c disposed on an upper surface of the first insulating layer 111a, a first wiring layer 112a disposed on the lower surface of the first insulating layer 111a and embedded in the second insulating layer 111b, and a second wiring layer 112b disposed on the third insulating layer 111c. The through-hole 110H may penetrate through the first to third insulating layers 111a, 111b, and 111c. A lower surface of the second insulating layer 111b coming in contact with the connection structure 140 may be coplanar with a lower surface of the first wiring layer 112a coming in contact with the connection structure 140. That is, the second insulating layer 111b and the first wiring layer 112a may have the same thickness as each other. The lower surface of the second insulating layer 111b coming in contact with the connection structure 140 and the lower surface of the first wiring layer 112a coming in contact with the connection structure 140 may be coplanar with a lower surface of the passivation layer 123 of the semiconductor chip 120. The second wiring layer 112b may be disposed to protrude on the third insulating layer 111c. That is, the second wiring layer 112b may be spaced apart from the first insulating layer 111a.

Generally, a fan-out semiconductor package has a structure in which the surrounding of a semiconductor chip is simply encapsulated and enclosed with an encapsulant such as an epoxy molding compound (EMC), or the like, and insulating layers and redistribution layers are formed below the semiconductor chip to implement redistribution of connection pads of the semiconductor chip. However, since the surrounding of the semiconductor chip is simply encapsulated and enclosed with the encapsulant, it is difficult to control warpage occurring due to various causes, there is a limitation in fixing the semiconductor chip, and it is difficult to utilize an encapsulating region as a routing region, such that a degree of freedom in design of a wiring, or the like, is reduced.

As a method of solving the above-mentioned problem, a method of providing a wider routing region while improving a warpage problem by forming a wiring layer, or the like, on both surfaces of an insulating layer having excellent rigidity, for example, a copper clad laminate, in a region in which the semiconductor chip is encapsulated to implement a frame may be considered. However, in a case of simply forming the wiring layer on both surfaces of the insulating layer having excellent rigidity using a plating method to implement the frame, due to a thickness of a lower wiring layer disposed to protrude, there is a step between a lower surface of the insulating layer and a lower surface of the lower wiring layer, and this step may cause a non-uniformity problem of an insulating distance in a redistribution region formed below the frame. In order to solve this problem, a method of embedding a wiring layer in an insulating layer through a coreless process to implement a frame may be considered, but in a case of using the coreless process, there are problems in that a number of processes may be required to increase a thickness of the frame, and price competitiveness may also be deteriorated.

On the contrary, since in the fan-out semiconductor package 100 according to the exemplary embodiment, the second and third insulating layers 111b and 111c and the first and second wiring layers 112a and 112b may be introduced on both surfaces of the first insulating layer 111a by a relatively simple build-up method, basically, a process may be simple, and price competitiveness may be excellent. However, since in the fan-out semiconductor package 100 according to the exemplary embodiment, a lower wiring layer 112a, that is, the first wiring layer 112a, of the frame 110 is embedded in the second insulating layer 111b, there is no step between the first wiring layer 112a and the lower surface of the second insulating layer 111b, and thus, a non-uniformity problem of the insulating distance may be solved. Further, the fan-out semiconductor package 100 according to the exemplary embodiment may have advantages in that an upper wiring layer 112b, that is, the second wiring layer 112b, of the frame 110 protrudes on the third insulating layer 111c, and thus, close adhesion with the encapsulant 130 may be improved, and it may be easy to open a surface of the second wiring layer 112b in a case of providing an upper/lower electrical connection path for introduction into a package-on-package (POP) structure.

The respective components included in the fan-out semiconductor package 100 according to the exemplary embodiment will hereinafter be described in more detail.

The frame 110 may further improve rigidity of the fan-out semiconductor package 100 depending on certain materials, and serve to secure uniformity of a thickness of the encapsulant 130. In a case of forming the wiring layers 112a and 112b, through-vias 113, and the like, in the frame 110, the fan-out semiconductor package 100 may be utilized as a package-on-package (POP) type package. The frame 110 may have a through-hole 110H. The semiconductor chip 120 may be disposed in the through-hole 110H to be spaced apart from the frame 110 by a predetermined distance. Side surfaces of the semiconductor chip 120 may be surrounded by the frame 110. However, such a form is only an example and may be variously modified to have other forms, and the frame 110 may perform another function depending on such a form.

The frame 110 may include the first insulating layer 111a, the second insulating layer 111b disposed on the lower surface of the first insulating layer 111a, the third insulating layer 111c disposed on the upper surface of the first insulating layer 111a, the first wiring layer 112a disposed on the lower surface of the first insulating layer 111a and embedded in the second insulating layer 111b, the second wiring layer 112b disposed on the third insulating layer 111c, and the through-vias 113 penetrating through the first and third insulating layers 111a and 111c and electrically connecting the first and second wiring layers 112a and 112b to each other. The through-vias 113 do not penetrate through the second insulating layer 111b.

A material of the first insulating layer 111a may be an insulating material. In this case, the insulating material may be a material suitable for a core layer, for example, a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), more specifically, prepreg, or the like, but is not limited thereto. A material of the second insulating layer 111b and the third insulating layer 111c may also be an insulating material. Here, the insulating material may be a material suitable for a build-up insulating layer, for example, a thermosetting resin such as an epoxy resin, a thermoplastic resin such as a polyimide resin, a resin in which the thermosetting resin or the thermoplastic resin is mixed with an inorganic filler, more specifically, an Ajinomoto Build-up film (ABF), or the like, but is not limited thereto.

The first insulating layer 111a may have a thickness greater than those of the second insulating layer 111b and the third insulating layer 111c. The first insulating layer 111a basically introduced as a core layer may have a relatively thick thickness, and the second insulating layer 111b and the third insulating layer 111c introduced as build-up insulating layers may have relatively thin thicknesses. The first insulating layer 111a may include an insulating material different from those of the second insulating layer 111b and the third insulating layer 111c as described above. In this viewpoint, the first insulating layer 111a may have an elastic modulus greater than those of the second and third insulating layers 111b and 111c.

The first and second wiring layers 112a and 112b may each include a conductive material such as copper (Cu), aluminum (Al), silver (Ag), tin (Sn), gold (Au), nickel (Ni), lead (Pb), titanium (Ti), or alloys thereof. The first and second wiring layers 112a and 112b may perform various functions depending on designs of the corresponding layers. For example, the first and second wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first and second wiring layers 112a and 112b may include via pads, wire pads, electrical connection structure pads, and the like. The first and second wiring layers 112a and 112b may be electrically connected to the connection pads 122 of the semiconductor chip 120 through redistribution layers 142.

The first wiring layer 112a may also be disposed on the lower surface of the first insulating layer 111a, similarly to the second insulating layer 111b, but may be embedded in the second insulating layer 111b. That is, the lower surface of the second insulating layer 111b coming in contact with the connection structure 140 may be coplanar with the lower surface of the first wiring layer 112a coming in contact with the connection structure 140. That is, the second insulating layer 111b and the first wiring layer 112a may have the same thickness as each other. The second insulating layer 111b and the first wiring layer 112a have same thickness also means that the thicknesses of the second insulating layer 111b and the first wiring layer 112a are substantially the same as each other. On the contrary, the second wiring layer 112b may protrude on the third insulating layer 111c. That is, the second wiring layer 112b may be spaced apart from the first insulating layer 111a. Therefore, there are advantages in that the non-uniformity problem of the insulating distance in the redistribution region may be solved as described above, and at the same time, close adhesion with the encapsulant 130 may be improved and it may be easy to open the surface of the second wiring layer 112b.

Meanwhile, a surface treatment layer PP may be formed on an exposed surface of the second wiring layer 112b, if necessary. The surface treatment layer PP is not particularly limited as long as it is known in the art. For example, the surface treatment layer may be formed by electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

Meanwhile, as described below, the first wiring layer 112a may include a first seed layer 111as1 and a third seed layer 111as3 as seed layers, and the second wiring layer 112b may include only a third seed layer 111as3 as a seed layer. That is, the number of seed layers of the first wiring layer 112a may be larger than that of seed layers of the second wiring layer 112b. That is, a total number of conductor layers of the first wiring layer 112a may be larger than that of conductor layers of the second wiring layer 112b. This may be understood as a structure feature caused by performing a process to be described below.

The through-vias 113 may electrically connect the first and second wiring layers 112a and 112b formed on different layers to each other to provide an electrical path in the frame 110. The through-vias 113 may penetrate through the first and third insulating layers 111a and 111c, but may not penetrate through the second insulating layer 111b. The through-vias 113 may also include a conductive material such as copper (Cu), aluminum (Al), silver (Ag), tin (Sn), gold (Au), nickel (Ni), lead (Pb), titanium (Ti), or alloys thereof. Each of the through-vias 113 may have an hourglass shape, but is not limited thereto. Each of the through-vias 113 may be a filled-type via but may also be a conformal-type via.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like; a logic chip such as an analog-to-digital converter, an application-specific IC (ASIC), or the like; a memory chip such as a volatile memory (for example, a DRAM), a non-volatile memory (for example, a ROM), a flash memory, or the like; or a power management IC (PMIC), or the like, but is not limited thereto. In addition, the above-mentioned elements may also be combined with each other and be disposed.

The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. As a material of each of the connection pads 122, a conductive material such as aluminum (Al), or the like, may be used without particular limitations. A passivation layer 123 exposing the connection pads 122 may be formed on the body 121, and may be an oxide film, a nitride film, or the like, or a double layer of an oxide film and a nitride film. A lower surface of each of the connection pads 122 may have a step with respect to a lower surface of the encapsulant 130 through the passivation layer 123. Resultantly, a phenomenon in which the encapsulant 130 bleeds into the lower surface of each of the connection pads 122 may be prevented to some extent. An insulating layer (not illustrated), and the like, may also be further disposed in other required positions. The semiconductor chip 120 may be a bare die, but may be a package type semiconductor chip in which if necessary, a redistribution layer (not illustrated) may be further formed on the active surface of the semiconductor chip 120, and bumps (not illustrated), or the like, may be connected to the connection pads 122.

The encapsulant 130 may protect the frame 110, the semiconductor chip 120, and the like. An encapsulation form of the encapsulant 130 is not particularly limited, but may be a form in which the encapsulant 130 surrounds at least portions of the frame 110, the semiconductor chip 120, and the like. For example, the encapsulant 130 may cover the frame 110 and an inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the connection structure 140. The encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, an Ajinomoto Build-up Film (ABF), FR-4, Bismaleimide Triazine (BT), or the like. If necessary, a photoimagable encapsulant (PIE) may also be used as the insulating material.

The connection structure 140 may redistribute the connection pads 122 of the semiconductor chip 120. Several tens to several hundreds of connection pads 122 of the semiconductor chip 120 having various functions may be redistributed by the connection structure 140, and may be physically or electrically externally connected through the electrical connection structures 170 depending on functions. The connection structure 140 may include insulating layers 141, redistribution layers 142 disposed on the insulating layers 141, and connection vias 143 penetrating through the insulating layer 141 and connected to the redistribution layer 142. The numbers of insulating layers 141, redistribution layers 142, and connection vias 143 may be larger than those illustrated in the accompanying drawings. Alternatively, the insulating layer 141, the redistribution layer 142, and the connection vias 143 may each be composed of only a single layer.

A material of the insulating layers 141 may be an insulating material. In this case, a photosensitive insulating material such as a photoimagable dielectric (PID) material may also be used as the insulating material. In this case, the insulating layers 141 may be formed to have a thinner thickness, and it may be easier to achieve a fine pitch of the connection vias 143. The materials of the respective insulating layers 141 may be the same as each other or may be different from each other.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, electrical connection structures pads, and the like.

The connection vias 143 may electrically connect the redistribution layers 142, the connection pads 122, the first wiring layer 112a, and the like, formed on different layers to each other, thereby forming an electrical path in the fan-out semiconductor package 100. A material of each of the connection vias 143 may be a conductive material such as copper (Cu), aluminum (Al), silver (Ag), tin (Sn), gold (Au), nickel (Ni), lead (Pb), titanium (Ti), or alloys thereof. Each of the connection vias 143 may be a filled-type via or a conformal-type via and may also have a tapered shape.

A passivation layer 150 may be disposed on the connection structure 140. The passivation layer 150 may protect the connection structure 140 from external physical or chemical damage, or the like. The passivation layer 150 may have openings 151 exposing at least portions of the redistribution layer 142 of the connection structure 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, an Ajinomoto Build-up Film (ABF), FR-4, Bismaleimide Triazine (BT), or the like. Alternatively, a solder resist may also be used.

Underbump metals 160 may be formed on the openings 151 of the passivation layer 150. The underbump metals 160 may improve connection reliability of the electrical connection structures 170 to improve board level reliability of the fan-out semiconductor package 100. The underbump metals 160 may be connected to the redistribution layer 142 of the connection structure 140 exposed through the openings 151 of the passivation layer 150. The underbump metals 160 may be formed on the openings 151 of the passivation layer 150 by any known metallization method using any known conductive metal such as a metal, but are not limited thereto.

The electrical connection structures 170 connected to the underbump metals 160 may be disposed on the passivation layer 150. Electrical connection structures 170 may physically or electrically externally connect the fan-out semiconductor package 100. For example, the fan-out semiconductor package 100 may be mounted on the mainboard of the electronic device through the electrical connection structures 170. The electrical connection structures 170 may include a low melting-point metal such as tin (Sn) or alloys including tin (Sn). More specifically, the electrical connection structures 170 may be formed of a solder, or the like, but is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metals 160 extending onto one surface of the passivation layer 150, and connection reliability may be more excellent. At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

A reinforcing layer 180 may be further disposed on the encapsulant 130. The reinforcing layer 180 may suppress warpage occurring in the fan-out semiconductor package 100. For example, the reinforcing layer 180 may suppress curing shrinkage of the material of the encapsulant 130, for example, a thermosetting resin film to suppress the warpage of the fan-out semiconductor package 100. The reinforcing layer 180 may have an elastic modulus relatively greater than that of the encapsulant 130, and may have a coefficient of thermal expansion (CTE) smaller than that of the encapsulant 130. In this case, a warpage suppression effect may be particularly excellent.

The reinforcing layer 180 may include a core material, an inorganic filler, and an insulating resin. For example, the reinforcing layer 180 may be formed of an unclad copper clad laminate (CCL), prepreg, or the like. When the reinforcing layer 180 includes the core material such as a glass fiber (or a glass cloth or a glass fabric), or the like, the reinforcing layer 180 may be implemented to have a relatively large elastic modulus, and when the reinforcing layer 180 includes the inorganic filler, the reinforcing layer 180 may be implemented to have a relatively small coefficient of thermal expansion by adjusting a content of the inorganic filler. The reinforcing layer 180 may be attached in a cured state (a c-stage) to the encapsulant 130. In this case, a boundary surface between the encapsulant 130 and the reinforcing layer 180 may have an approximately linear shape. Meanwhile, the inorganic filler may be silica, alumina, or the like, and the resin may be an epoxy resin, or the like. However, the inorganic filler and the resin are not limited thereto.

A resin layer 190 may be further disposed on the reinforcing layer 180. The resin layer 190 may be disposed on the reinforcing layer 180. The resin layer 190 may be formed of a material that is the same as or similar to that of the encapsulant 130, for example, an insulating material that includes an inorganic filler and an insulating resin, but does not include a core material, that is, ABF, or the like. That is, the reinforcing layer 180 may have an elastic modulus greater than that of the resin layer 190. When the reinforcing layer 180 includes the core material, or the like, it is difficult to form openings 195 in the reinforcing layer 180 itself, but when the resin layer 190 is added, it may be easy to form the openings 195. The openings 195 may penetrate through the encapsulant 130, the reinforcing layer 180, and the resin layer 190, and may expose at least portions of the second wiring layer 112*b* of the frame 110. The surface treatment layer PP as described above may be formed on the exposed surface of the second wiring layer 112*b*. The openings 195 may be utilized as openings for marking. Alternatively, the openings 195 may be utilized as openings for exposing pads in a POP structure. Alternatively, the openings 195 may be utilized as openings for mounting a surface mounted technology (SMT) component. When the resin layer 190 is disposed, the warpage may be more easily suppressed.

Meanwhile, although not illustrated in the drawings, a metal thin film may be formed on the walls of the through-hole 110H, if necessary, in order to dissipate heat and/or block electromagnetic waves. In addition, a plurality of semiconductor chips 120 performing functions that are the same as or different from each other may be disposed in the through-hole 110H, if necessary. In addition, if necessary, a separate passive component such as an inductor, a capacitor, or the like, may be disposed in the through-hole 110H. Further, if necessary, a plurality of through-holes 110H may be formed, and the semiconductor chips 120 and/or passive components may be disposed in the through-holes 110H, respectively. In addition, if necessary, a passive component, for example, a surface mounting technology (SMT) component including an inductor, a capacitor, or the like, may be disposed on a surface of the passivation layer 150.

Figure 11:
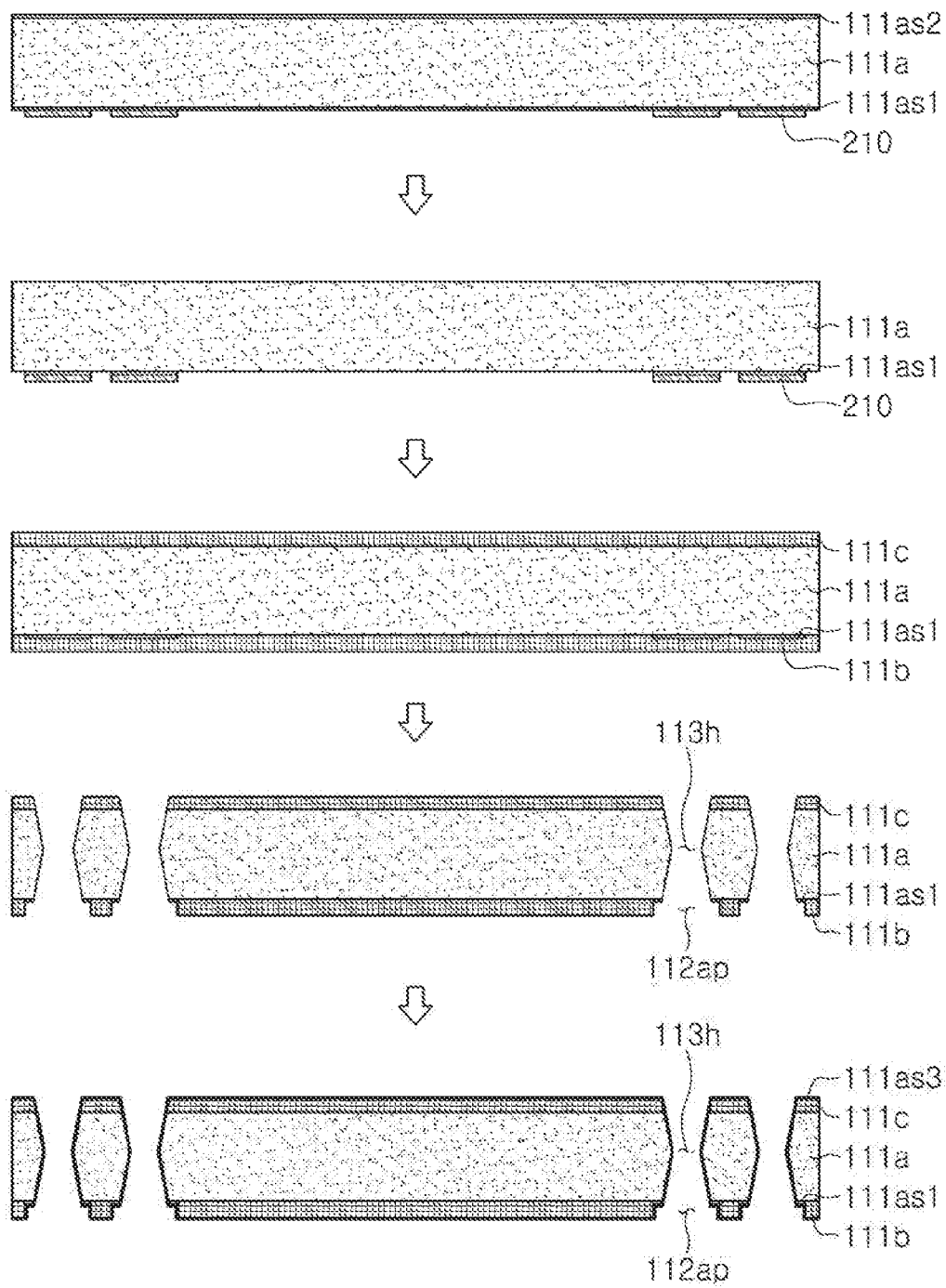
FIGS. 11 and 12 are schematic views illustrating an example of processes of manufacturing a frame of the fan-out semiconductor package of FIG. 9.
Figure 12:
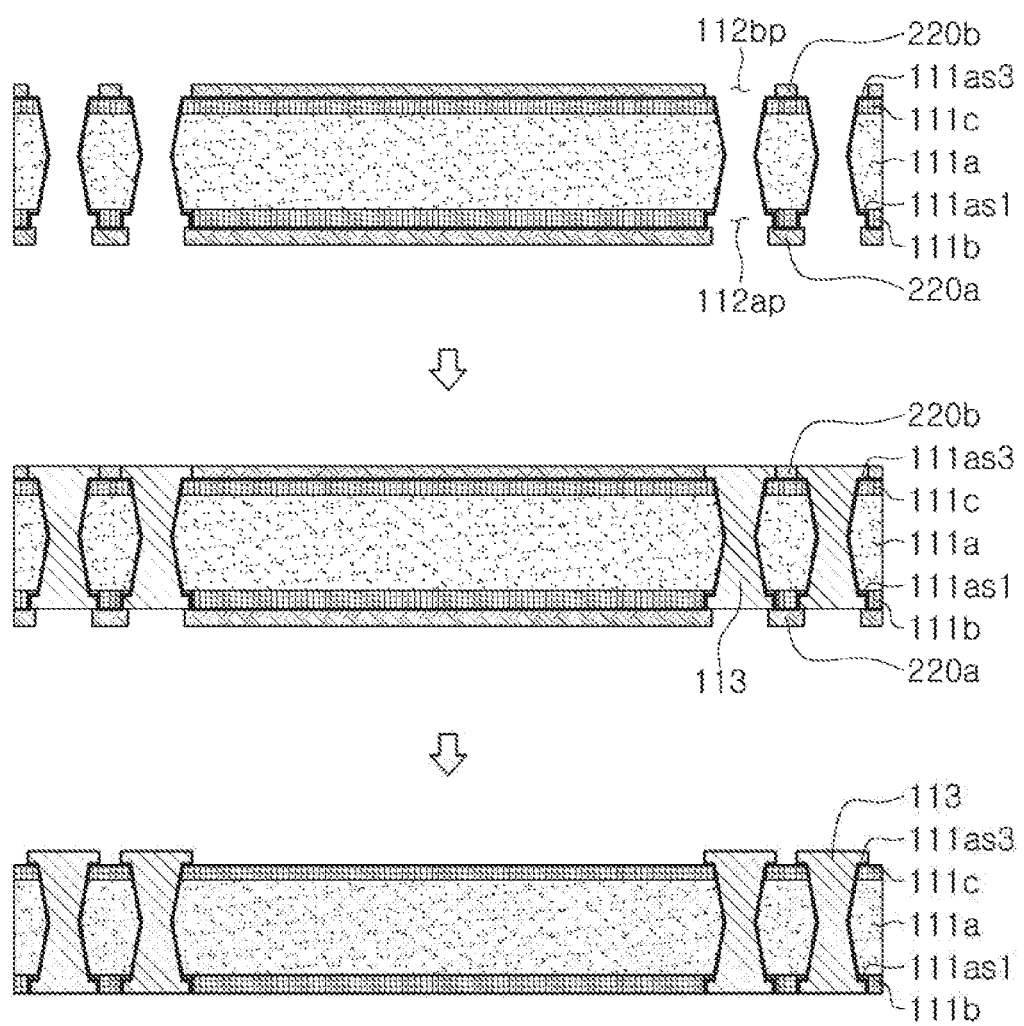

FIGS. 11 and 12 are schematic views illustrating an example of processes of manufacturing a frame of the fan-out semiconductor package of FIG. 9.

Referring to FIG. 11, first, a core member in which the first seed layer 111*as*1 and the second seed layer 111*as*2 are formed on both surfaces of the first insulating layer 111*a* may be prepared. The core member as described above may be, for example, a copper clad laminate (CCL) in which copper foil is formed on both surfaces of prepreg. Next, a patterned first dry film 210 may be formed on the first seed layer 111*as*1. Then, the first seed layer 111*as*1 may be patterned by a plating method such as a tenting method, or the like. The second seed layer 111*as*2 may be removed. Then, the second and third insulating layers 111*b* and 111*c* may be formed on both surfaces of the first insulating layer 111*a*, respectively. The second and third insulating layers 111*b* and 111*c* may each be formed by a method of laminating ABF in a b-stage on the first insulating layer 111*a* and then curing the ABF, or a method of applying a material similar to the ABF on the first insulating layer 111*a* and then curing the applied material. The second insulating layer 111*b* may cover the patterned first seed layer 111*as*1. Next, the second insulating layer 111*b* may be patterned so as to have a specific opening pattern 112*ap* corresponding to a first wiring layer 112*a* to be formed later using the patterned first seed layer 111*as*1 as a stopper layer, and through-via holes 113*h* penetrating through the first and third insulating layers 111*a* and 111*c* and the first seed layer 111*as*1 may be formed using a mechanical drill and/or a laser drill, or the like. Then, the third seed layer 111*as*3 may be formed on entire surfaces of the second and third insulating layers 111*b* and 111*c*, walls of the through-via holes 113*h*, and an entire surface of the first seed layer 111*as*1 using a chemical copper plating method, or the like.

Referring to FIG. 12, next, second and third dry films 220*a* and 220*b* may be formed on the second and third insulating layers 111*b* and 111*c*, respectively. Thereafter, the second and third dry films 220*a* and 220*b* may be exposed and developed using a photolithography method, such that opening patterns (not denoted by a reference numeral) exposing the above-mentioned opening pattern 112*ap* but partially blocking the pattern 112*ap* may be formed on the second dry film 220*a*, and a specific opening pattern 112*bp* may also be formed on the third dry film 220*b* so as to correspond to a second wiring layer 112*b* to be formed later. Next, the first and second wiring layers 112*a* and 112*b* and the through-vias 113 may be formed using a pattern fill plating method, or the like. Since the first and second wiring layers 112*a* and 112*b* and the through-vias 113 are simultaneously formed, the first and second wiring layers 112*a* and 112*b* and the through-vias 113 may be integrated without a boundary therebetween to configure a single plating layer. Then, the second and third dry films 220*a* and 220*b* may be delaminated, and an unnecessary third seed layer 111*as*3 remaining on the second and third insulating layers 111*b* and 111*c* may be removed by etching. A frame 110 before forming the through-hole 110H may be manufactured through a series of processes.

Meanwhile, as seen in the series of processes, the first wiring layer 112*a* may include a first seed layer 111*as*1 and the third seed layer 111*as*3 as seed layers, and the second wiring layer 112*b* may include only the third seed layer 111*as*3 as a seed layer. That is, the number of seed layers of the first wiring layer 112*a* may be larger than that of seed layers of the second wiring layer 112*b*. That is, a total number of conductor layers of the first wiring layer 112*a* may be larger than that of conductor layers of the second wiring layer 112*b*. This may be understood as a structure feature caused by performing the process described above.

As set forth above, according to exemplary embodiments in the present disclosure, the fan-out semiconductor package in which the frame including the wiring layer formed therein may be introduced to the region in which the semiconductor chip is encapsulated using a relatively simple and economical method and non-uniformity of an insulating distance of a redistribution region occurring due to a thickness of the wiring layer may be solved may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a frame including a first insulating layer, a second insulating layer disposed on a first surface of the first insulating layer, a third insulating layer disposed on a second surface of the first insulating layer opposing the first surface, a first wiring layer disposed on the first surface of the first insulating layer and embedded in the second insulating layer, and a second wiring layer disposed on the third insulating layer, and having a through-hole penetrating through the first to third insulating layers;
a semiconductor chip disposed in the through-hole and having an active surface on which connection pads are disposed and an inactive surface opposing the active surface;
an encapsulant covering at least portions of each of the frame and the semiconductor chip and filling at least portions of the through-hole; and
a connection structure disposed on the frame and the active surface of the semiconductor chip and including redistribution layers electrically connected to the connection pads,
wherein the first and second wiring layers are electrically connected to the connection pads, and
wherein a surface of the second insulating layer coming in contact with the connection structure is coplanar with a surface of the first wiring layer coming in contact with the connection structure.

2. The fan-out semiconductor package of claim 1, wherein the second insulating layer and the first wiring layer have the same thickness as each other.

3. The fan-out semiconductor package of claim 1, wherein a lower surface of the second insulating layer coming in contact with the connection structure and a lower surface of the first wiring layer coming in contact with the connection structure are coplanar with a lower surface of a passivation layer of the semiconductor chip exposing the connection pads.

4. The fan-out semiconductor package of claim 1, wherein the second wiring layer protrudes on the third insulating layer.

5. The fan-out semiconductor package of claim 1, wherein the frame further includes through-vias penetrating through the first and third insulating layers and electrically connecting the first and second wiring layers to each other.

6. The fan-out semiconductor package of claim 1, wherein the first insulating layer has a thickness thicker than those of the second and third insulating layers.

7. The fan-out semiconductor package of claim 6, wherein the first insulating layer has an elastic modulus greater than those of the second and third insulating layers.

8. The fan-out semiconductor package of claim 1, further comprising a reinforcing layer disposed on the encapsulant, wherein the reinforcing layer has an elastic modulus greater than that of the encapsulant.

9. The fan-out semiconductor package of claim 8, further comprising a resin layer disposed on the reinforcing layer, wherein the reinforcing layer has the elastic modulus greater than that of the resin layer.

10. The fan-out semiconductor package of claim 9, further comprising openings penetrating through the resin layer, the reinforcing layer, and the encapsulant and exposing at least portions of the second wiring layer.

11. The fan-out semiconductor package of claim 10, further comprising a surface treatment layer disposed on a surface of the exposed second wiring layer.

12. The fan-out semiconductor package of claim 1, further comprising:
a passivation layer disposed on the connection structure and having a plurality of openings exposing at least portions of the redistribution layers, respectively;
a plurality of underbump metal layers disposed on the plurality of openings of the passivation layer, respectively, and connected to the exposed redistribution layers, respectively; and
a plurality of electrical connection structures disposed on the passivation layer, respectively, and connected to the plurality of underbump metal layers, respectively.

13. The fan-out semiconductor package of claim 1, wherein a portion of an insulating layer of the connection structure has a uniform thickness,
the portion of the insulating layer of the connection structure is in physical contact with the second insulating layer and the first wiring layer.

14. A fan-out semiconductor package comprising:
a frame including a first insulating layer, a second insulating layer disposed on a first surface of the first insulating layer, a third insulating layer disposed on a second surface of the first insulating layer opposing the first surface, a first wiring layer disposed on the first surface of the first insulating layer and embedded in the second insulating layer, and a second wiring layer disposed on the third insulating layer, and having a through-hole penetrating through the first to third insulating layers;
a semiconductor chip disposed in the through-hole and having an active surface on which connection pads are disposed and an inactive surface opposing the active surface;
an encapsulant covering at least portions of each of the frame and the semiconductor chip and filling at least portions of the through-hole; and
a connection structure disposed on the frame and the active surface of the semiconductor chip and including redistribution layers electrically connected to the connection pads,
wherein the first and second wiring layers are electrically connected to the connection pads, and
wherein a number of conductor layers of the first wiring layer is larger than a number of conductor layers of the second wiring layer.

15. The fan-out semiconductor package of claim 14, wherein the first wiring layer includes a first seed layer and a first plating layer, the second wiring layer includes a second seed layer and a second plating layer, and a number of layers of the first seed layer is greater than a number of layers of the second seed layer.

16. A fan-out semiconductor package comprising:
a frame including a first wiring layer embedded in an insulating material so that a lower surface of the first wiring layer is exposed in a lower portion of the frame and a second wiring layer protruding on the insulating material in an upper portion of the frame, and having a through-hole;
a semiconductor chip disposed in the through-hole and having connection pads;
an encapsulant covering at least portions of each of the frame and the semiconductor chip and filling at least portions of the through-hole;

a connection structure disposed below the frame and the semiconductor chip and including redistribution layers electrically connected to the connection pads;
a reinforcing layer disposed on the encapsulant; and
a resin layer disposed on the reinforcing layer.

* * * * *